United States Patent [19]

Nakashima

[11] Patent Number: 5,229,645
[45] Date of Patent: Jul. 20, 1993

[54] SEMICONDUCTOR DEVICE AND MANUFACTURING METHOD THEREOF

[75] Inventor: Moriyoshi Nakashima, Hyogo, Japan

[73] Assignee: Mitsubishi Denki Kabushiki Kaisha, Tokyo, Japan

[21] Appl. No.: 709,607

[22] Filed: Jun. 5, 1991

[30] Foreign Application Priority Data

Jun. 21, 1990 [JP] Japan .................................. 2-163655
Mar. 22, 1991 [JP] Japan .................................. 3-57545

[51] Int. Cl.⁵ ........................ H01L 21/88; H01L 21/90
[52] U.S. Cl. ................................. 257/773; 257/774; 257/775; 257/776
[58] Field of Search ........................ 357/51, 71, 68; 257/773, 774, 775, 776

[56] References Cited

U.S. PATENT DOCUMENTS

| | | | |
|---|---|---|---|
| 4,510,678 | 4/1985 | Eggers | 357/71 |
| 4,536,949 | 8/1985 | Takayama et al. | 357/51 |
| 4,638,400 | 1/1987 | Brown et al. | 357/51 |
| 4,737,838 | 4/1988 | Watanabe | 357/68 |
| 4,754,318 | 6/1988 | Momose et al. | 357/71 |
| 4,774,561 | 9/1988 | Takagi | 357/71 |
| 4,811,076 | 3/1989 | Tigelaar et al. | 357/51 |
| 4,876,582 | 10/1989 | Janning | 357/23.5 |
| 4,890,148 | 12/1989 | Ikeda et al. | 357/45 |
| 4,961,104 | 10/1990 | Hirakawa | 357/71 |
| 5,086,370 | 2/1992 | Yasaitis | 357/51 |

FOREIGN PATENT DOCUMENTS

| | | |
|---|---|---|
| 3530897 | 3/1986 | Fed. Rep. of Germany . |
| 59-188143 | 10/1984 | Japan . |
| 62-199037 | 9/1987 | Japan . |
| 62-298135 | 12/1987 | Japan . |
| 63-42144 | 2/1988 | Japan . |
| 63-268258 | 11/1988 | Japan . |

OTHER PUBLICATIONS

Berenbaum, "Increasing resistance to electromigration in thin metal films," IBM TDB, vol. 14, No. 2, Jul. 1971 pp. 601–602.

English abstract of Japanese Patent Laying Open No. 62-42524 laid open Feb. 24, 1987.

Primary Examiner—Eugene R. LaRoche
Assistant Examiner—Viet Q. Nguyen
Attorney, Agent, or Firm—Lowe, Price, LeBlanc & Becker

[57] ABSTRACT

The semiconductor device includes a silicon substrate, a conductor thin film formed over the surface of the silicon substrate with a first insulating film interposed therebetween, a second insulating film covering the upper surface of the conductor thin film, and an interconnection layer formed on the second insulating film. A contact hole is formed in the second insulating film and the conductor thin film and the interconnection layer are electrically connected to each other through the contact hole. An insulator layer or a conductor layer in an electrically floating state is selectively formed between the conductor thin film and the surface of the silicon substrate at least immediately below the contact hole. The semiconductor device is formed, for example, by selectively forming a conductor layer on the first insulating film, covering the exposed surface thereof with an insulating film, and then depositing the conductor thin film. In accordance with the semiconductor device and the manufacturing method thereof, even if the conductor thin film is penetrated by an anisotropic etching at the time of forming the contact hole, insulation between the silicon substrate and the conductor thin film is ensured without fail, and a highly reliable semiconductor device can be provided with high productivity, having no defect due to dielectric breakdown.

11 Claims, 12 Drawing Sheets

SEMICONDUCTOR DEVICE AND MANUFACTURING METHOD THEREOF

BACKGROUND OF THE INVENTION

1. Field of the Invention

The invention relates generally to semiconductor devices and manufacturing methods thereof and, more particularly, relates to structures in which it is intended to enhance characteristics of semiconductor devices using a thin conductor film as an electrode or an electric interconnection, and manufacturing methods thereof.

2. Description of the Background Art

With increased integration density of a semiconductor device in recent years, techniques of a higher level have been needed and developed for forming a conductor film constituting an electrode or an electric interconnection. Particularly, as a semiconductor is miniaturized and more layers are formed therein for higher integration density, a thinner conductor film is required for realizing planarization.

A description will be made in the following as to a conventional manufacturing process of a semiconductor device using a thin conductor film as an electrode or an electric interconnection, referring to FIGS. 1A to 1C.

Firstly, an insulating film 2 including an oxide silicon film or the like for interlayer insulation is formed on a p-type silicon substrate 1 having an impurity concentration of the order of $1 \times 10^{15}/cm^3$ by the well-known thermal oxidation method. Furthermore, a conductor thin film 3 for electrode interconnection made of polysilicon is deposited by the chemical vapor deposition and then treated as a desired electrode pattern using a photolithography and an etching technique. Subsequently, an insulating film 4 for interlayer insulation and smooth coating is deposited by the chemical vapor deposition (see FIG. 1A). Then, a contact hole 6 for electrically connecting the conductor thin film 3 to an external circuit is apertured by the photolithography and dry etching technique using a resist mask 7 and by the wet etching technique (see FIG. 1B). After that, an aluminum layer for electrically connecting the electrode with the external circuit is deposited by the sputtering technique and treated into a desired configuration by the photolithography and the etching technique to form an interconnection layer 5 made of aluminum (see FIG. 1C).

In accordance with the conventional semiconductor device structured as stated above, when the conductor thin film 3 is made thin for planarization with the miniaturization, part of the conductor thin film 3 tends to be etched by over etching for selectively removing the insulating film 4 at the time of forming the contact hole 6 as shown in FIG. 1B. Therefore, the contact hole 6 is formed in this portion, leading to the silicon substrate 1 through the underlying insulating film 2. In this case, there has been a problem that the silicon substrate 1 and the conductor thin film 3 are electrically connected to each other due to the formation of the interconnection layer 5.

There have been conventional techniques for solving the above-mentioned problem, in which a polysilicon layer 8 is selectively formed between the conductor thin film 3 and the silicon substrate 1 in a region in the vicinity of the contact hole 6, as shown in FIG. 2, to prevent etching from proceeding to the surface of the silicon substrate 1 (for example, see Japanese Patent Laying-Open No. 63-268258).

In the structure disclosed in the above-mentioned publication, however, there were problems as follows.

Now suppose that the structure shown in FIG. 2 is employed for forming an electrode, an electric interconnection or a resistor as shown in FIGS. 3 and 4. The structure shown in FIG. 3 and FIG. 4 (a sectional view taken along the line A—A of FIG. 3) is obtained by forming an insulating film 12 on a silicon substrate 11, selectively depositing a conductor layer 18 made of polysilicon on the surface of it, furthermore, depositing a conductor thin film 13 of polysilicon over the entire surface of the silicon substrate 11, and then applying a photolithography and etching to a resist film 19 to pattern the same. After that, in selectively removing the conductor thin film 13 by etching, the state shown in FIG. 5A is shifted to the state shown in FIG. 5B with the conductor thin film 13 and the conductor layer 18 being selectively removed in the cross section B—B of FIG. 3. In the cross section C—C of FIG. 3, however, only the conductor thin film 13 must be selectively removed by etching since there is no conductor layer 18. Therefore, while etching of the conductor layer 18 proceeds in the cross section B—B, the etching proceeds from the state of FIG. 6A even after the conductor thin film 13 has been removed, and as shown in FIG. 6B, etching of the side portion of the conductor thin film 13, that is to say side etching, and etching of the surface of the insulating film 12 proceed in the cross section C—C. Accordingly, there is a problem that the pattern configuration of the conductor thin film 13 in the cross section C—C becomes narrow.

It is considered that the resist film 19 is patterned so as to cover the whole region in which the conductor layer 18 is selectively formed to effect etching of the conductor thin film 13 as shown in FIGS. 7 and 8. In accordance with the method, a portion 13a indicated by a two-dot chain line may be only removed by etching in the cross section B—B of FIG. 7 as shown in FIG. 9A. Accordingly, the portion 13a indicated by the two-dot chain line is removed and patterns of an electric interconnection and a resistor and so on including the conductor thin film 13 are formed in the cross section C—C of FIG. 7 in the same period of time as shown in FIG. 9B.

In this case, however, it is essential for the resist film 19 to cover the entire surface of the region of the conductor layer 18 without fail and if even a slight slipping of patterning is caused, part of the conductor layer 18 remains after etching of the conductor thin film 13. Therefore, there is a problem that it is necessary to take a margin by which the resist film 19 may cover the entire surface on the region of the conductor layer 18 even if a little slipping off of patterning is caused and that the area occupied by the electric interconnection and the resistor to be formed becomes unnecessarily large.

Additionally, in the technique of the above-mentioned publication, since the conductor thin film 3 and the polysilicon layer 8 are directly in contact with each other, an interlayer insulating film must be interposed between the conductor film deposited for forming the conductor thin film 3 and the polysilicon layer deposited for forming the polysilicon layer 8 in order to utilize each of them as an individual device element in other regions. In other words, there is a problem that it is difficult to form the conductor thin film 3 and the polysilicon layer 8 simultaneously in forming a conductor layer which exists as an individual device element in other region.

SUMMARY OF THE INVENTION

An object of the invention is to provide a structure of a semiconductor device and manufacturing method thereof, in which in forming an interconnection layer above a conductor thin film and electrically connecting both of them through a contact hole, electrical isolation from a silicon substrate is surely held and a minimum configuration required of the conductor thin film can be patterned without fail.

Another object of the invention is to provide a semiconductor device having a structure in which it is possible to simultaneously form conductor layers existing as individual device elements in other regions in the process of forming them.

The semiconductor device in accordance with the present invention to achieve the above-mentioned objects includes a silicon substrate, a conductor thin film formed over the surface of the silicon substrate with a first insulating film interposed therebetween, a second insulating film covering the upper surface of the conductor thin film and an interconnection layer formed on the second insulating film. A contact hole is formed in the second insulating film and the conductor thin film and the interconnection layer are electrically connected to each other through this contact hole. The semiconductor device is characterized in that an insulator layer or an conductor layer in an electrically floating state with its periphery covered with an insulating film is selectively formed between the conductor thin film and the silicon substrate at least immediately below the contact hole.

According to the method of manufacturing the semiconductor device in accordance with the present invention, firstly, a first insulating film for interlayer insulation is formed on the silicon substrate and a conductor layer is selectively formed in a predetermined region thereon. Then, after covering the entire exposed surface of this conductor layer with an insulating film, a conductor thin film is deposited over the first insulating film and the insulating film covering the conductor layer. After that, a second insulating film for interlayer insulation is deposited on the semiconductor thin film and a contact hole for electrically connecting the conductor thin film and an external circuit is apertured in the third insulating film so that part of the surface of the conductor thin film is exposed in a position above the region in which the conductor layer is selectively formed. Then, furthermore, an interconnection layer is formed on the second insulating film and in a region including the inner portion of the contact hole, and is electrically connected to the conductor thin film.

The present invention also provides a manufacturing method in which in place of selectively forming a conductor layer in a predetermined region on a first insulating film, an insulator layer is selectively formed in the same region and a conductor thin film is deposited on the insulator layer in the above-mentioned manufacturing process.

In accordance with the semiconductor device and the manufacturing method thereof of the present invention, in a process of etching to aperture a contact hole, even if a conductor thin film is penetrated and an interconnection layer cuts into it, the penetration into a silicon substrate is prevented and insulation between the silicon substrate and the conductor thin film is ensured by selectively forming an insulator layer or a conductor layer in an electrically floating state between the conductor thin film and the silicon substrate at least immediately below the contact hole. Additionally, as is different from the case in which the single crystal silicon layer for preventing penetration is directly in contact with the conductor thin film as in the conventional technique, in patterning the conductor thin film, polysilicon is not exposed in the peripheral region by selectively removing the conductor thin layer only, so that it will be possible to further form another interconnection layer in the region. Therefore, it will be unnecessary to expand a margin taking account of generation of side etching of the conductor thin film and slipping off of the patterning.

Furthermore, in accordance with a structure in which a conductor layer in an electrically floating state is interposed between the conductor thin film and the silicon substrate, simultaneously in a process of forming two conductor layers which exist as separate device elements in other region, it will also be possible to form the conductor thin film and the electrically floating conductor layer immediately below it and improve the efficiency in manufacturing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Descriptions will be made of embodiments according to the present invention in the following, with reference to the drawings.

Figure 1A:
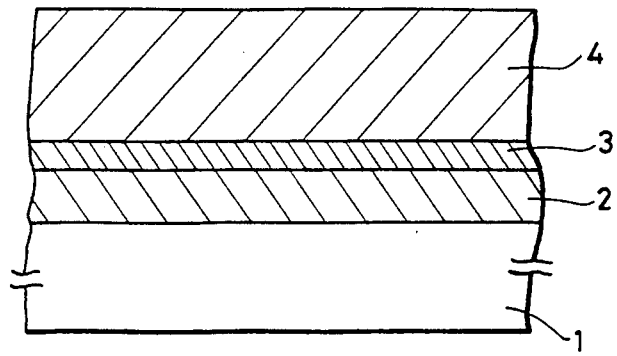
FIGS. 1A, 1B, 1C are cross sectional views showing a conventional manufacturing method when a contact hole and an interconnection layer are formed in a multi-layer structure including a conductor thin film and an insulating film on a silicon substrate in order of process.
Figure 1B:
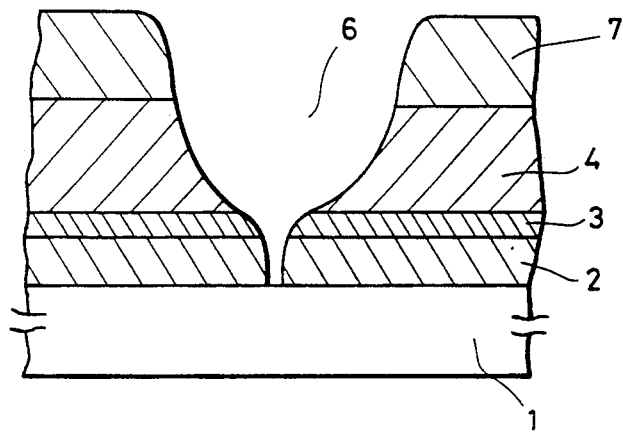
Figure 1C:
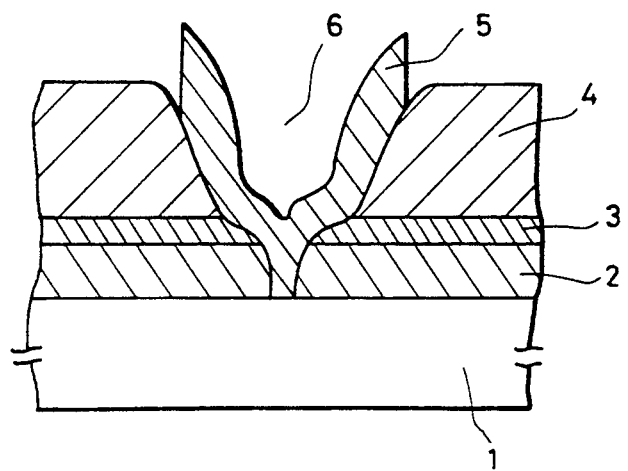
Figure 2:
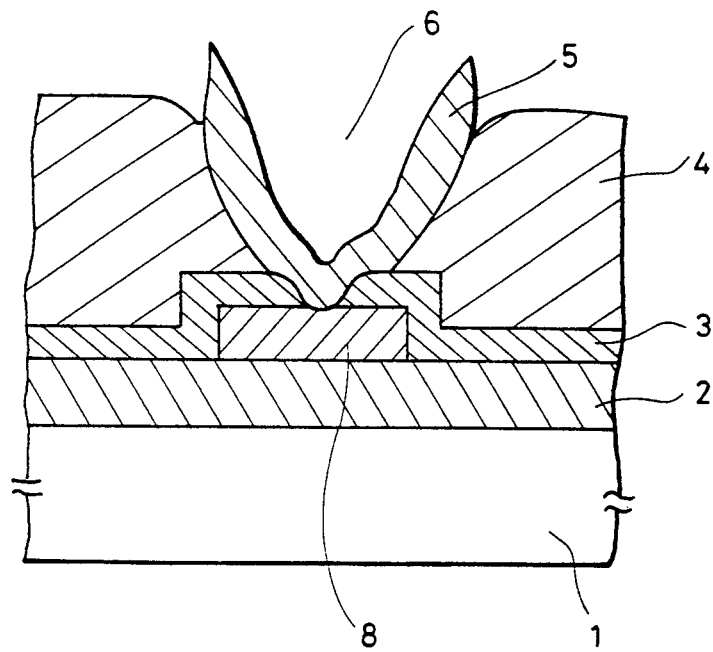
FIG. 2 is a cross sectional view showing a structure of a conventional semiconductor device for solving a problem caused in the conventional manufacturing processes shown in FIGS. 1A to 1C.
Figure 3:
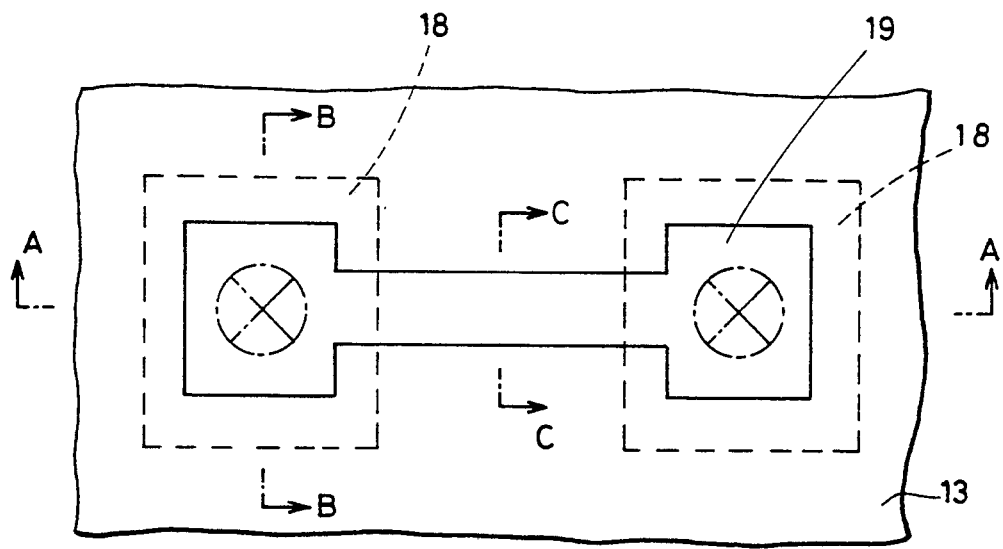
FIG. 3 is a diagram for explaining a first problem when the structure of the conventional semiconductor device shown in FIG. 2 is employed.
Figure 4:
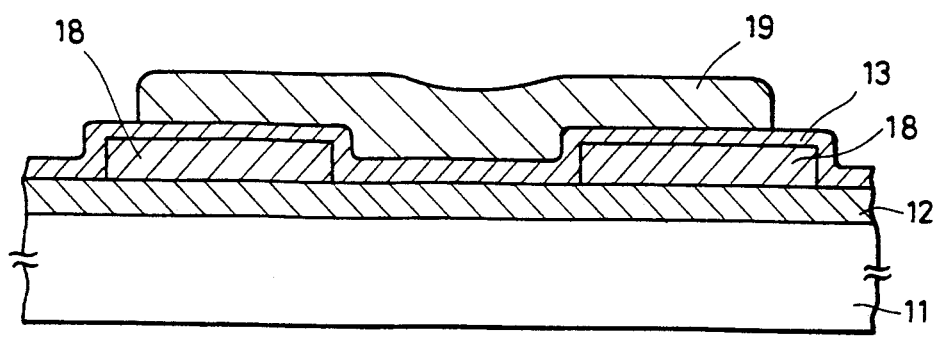
FIG. 4 is a cross sectional view taken along the line A—A in FIG. 3.
Figure 5A:
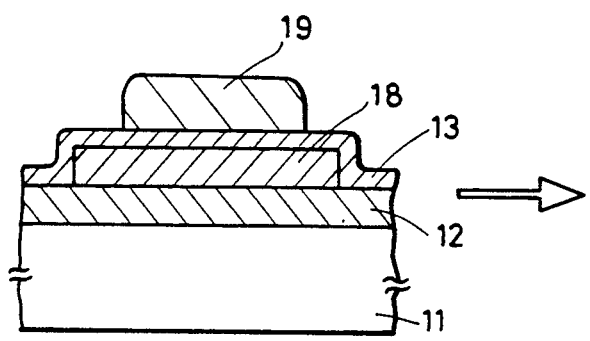
FIG. 5A is a cross sectional view taken along the line B—B in FIG. 3.
Figure 5B:
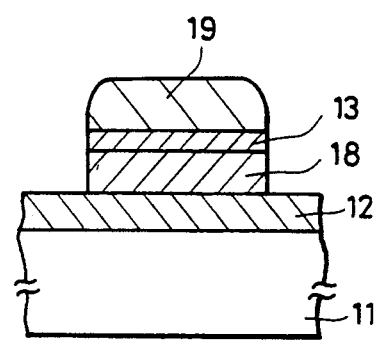
FIG. 5B is a cross sectional view showing a configuration of the same cross section as in FIG. 5A after dry etching is applied.
Figure 6A:
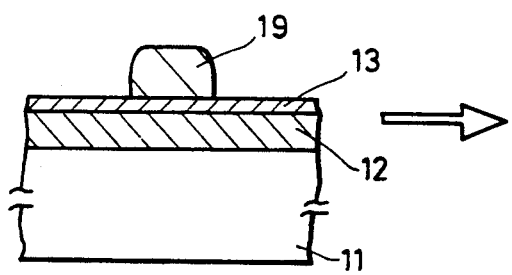
FIG. 6A is a cross sectional view taken along the line C—C of FIG. 3.
Figure 6B:
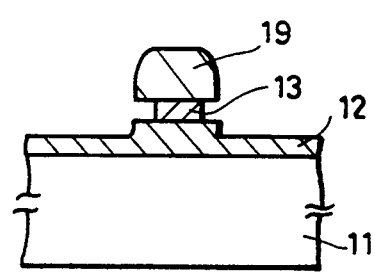
FIG. 6B is a cross sectional view showing a configuration of the same cross section as in FIG. 6A after dry etching is applied.
Figure 7:
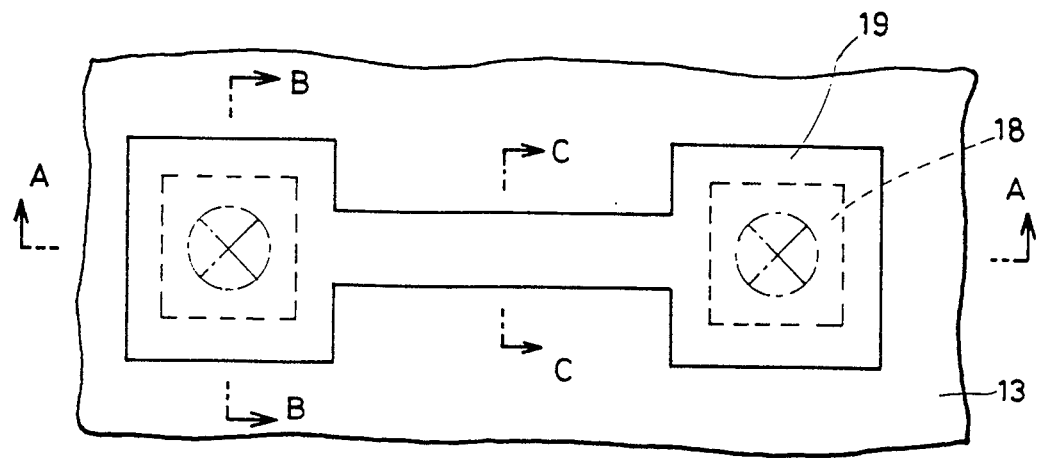
FIG. 7 is a diagram for explaining a second problem when the structure of the conventional semiconductor device shown in FIG. 2 is employed.
Figure 8:
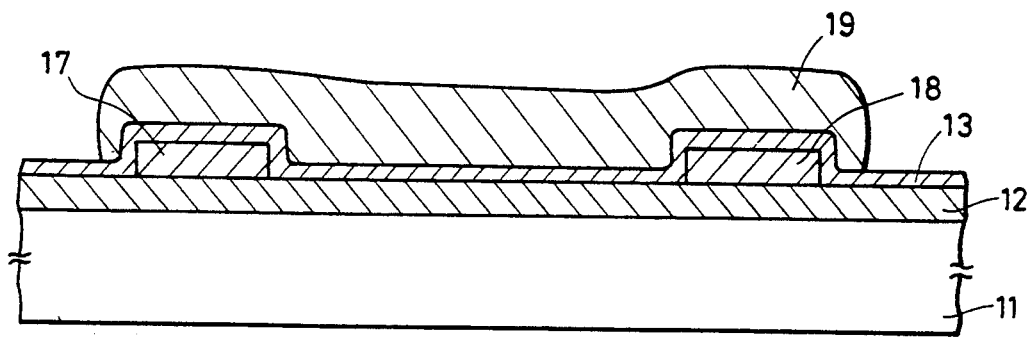
FIG. 8 is a cross sectional view taken along the line A—A in FIG. 7.
Figure 9A:
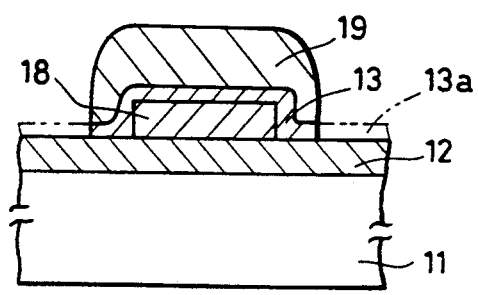
FIG. 9A is a cross sectional view showing a configuration of the cross section taken along the line B—B in FIG. 7 after dry etching is applied.
Figure 9B:
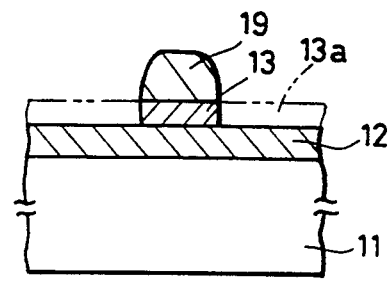
FIG. 9B is a cross sectional view showing a configuration of the cross section taken along the line C—C in FIG. 7 after dry etching is applied.
Figure 10:
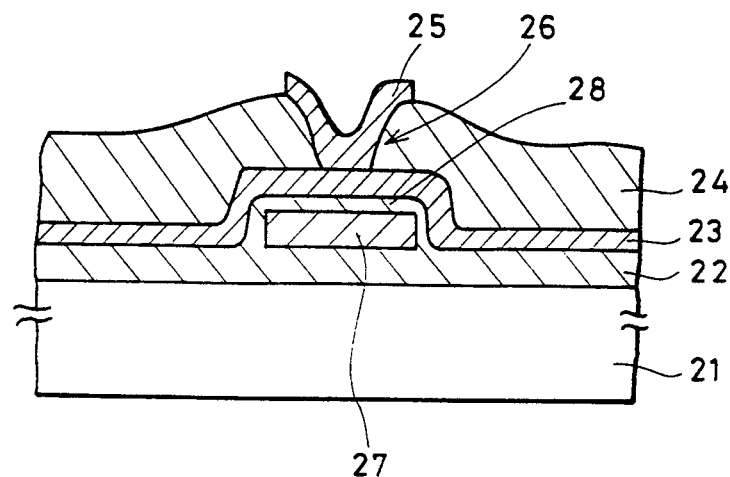
FIG. 10 is a cross sectional view showing a structure of a semiconductor device in accordance with a first embodiment of the present invention.

FIG. 10 shows a structure of a cross section of a semiconductor device in accordance with a first embodiment of present invention. In this semiconductor device, a first insulating film 22 of oxide silicon film having a thickness of about 500Å is formed on a p-type silicon substrate 21 having a concentration of the order of $1 \times 10^{15}$/cm$^3$, and furthermore, a conductor thin film 23 of polysilicon is formed over the upper surface of it, having a thickness of 200Å–500Å. A second insulating film 24 as an interlayer insulating film is formed on the upper surface of the conductor thin film 23, having a thickness of the order of 3000Å, and an interconnection layer 25 including aluminum or the like is patterned on the upper surface thereof. The interconnection layer 25 is electrically connected to the conductor thin film 23 through a contact hole 26 formed in a predetermined position of the second insulating film 24. A conductor layer 27 in an electrically floating state by being covered with an insulating film 28 is formed between the first insulating film 22 and the conductor thin film 23 in a region immediately below the contact hole 26.

In accordance with such a structure, the conductor thin film 23 can be electrically connected to the interconnection layer 25 with a low contact resistance, and even if the conductor thin film 23 is penetrated at the time of forming the contact hole 26, isolation/insulation between the semiconductor substrate 21 and the interconnection layer 25 and so on is ensured.

Figure 11:
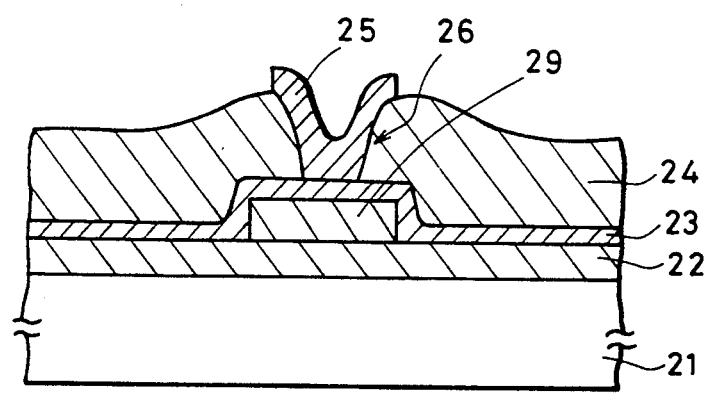
FIG. 11 is a cross sectional view showing a structure of a semiconductor device in accordance with a second embodiment of the present invention.

A description will now be made of the structure of the semiconductor device in accordance with the second embodiment of the present invention, referring to FIG. 11. The structure in accordance with this embodiment is the same as the above-described first embodiment except that an insulator layer 29 of oxide silicon is selectively formed, in place of the conductor layer 27 covered with the insulating film 28, between the first insulating film 24 and the conductor thin film 23 in the region immediately below the contact hole 26.

In accordance with the structure of this embodiment also, isolation/insulation between the semiconductor substrate 21 and the interconnection layer 25 and so on is ensured even if the conductor thin film 23 is penetrated at the time of forming the contact hole 26.

A manufacturing method of the semiconductor device in each of the above-described embodiments will now be described with reference to the drawings.

Referring to FIGS. 12A to 12F, the semiconductor device in accordance with the first embodiment above is manufactured as follows. Firstly, the first insulating film 22 of oxide silicon is formed to have a thickness of about 500Å on the main surface of the p-type semiconductor substrate 21 of the order of $1 \times 10^{15}$/cm$^3$ by the thermal oxidation method. After that, a polysilicon or a polysilicon doped with impurities is deposited on the entire surface of the first insulating film 22 by the CVD method or the like to form a conductor film 27a having a thickness of the order of 1000Å or above and a resist film 30 is patterned on the surface thereof by the photolithography (see FIG. 12A). Then, the conductor layer 27 having a predetermined pattern is selectively formed by applying an anisotropic etching in accordance with a reactive ion etching (see FIG. 12B). Subsequently, after forming the insulating film 28 of the order of 100Å–500Å to cover at least the exposed surface of the conductor layer 27 by the thermal oxidation method or the like, the conductor thin film 23 of polysilicon doped with impurities is formed over the entire surface of the semiconductor substrate 21 to have a thickness of 200Å–500Å by the CVD method (see FIG. 12C).

Figure 12A:
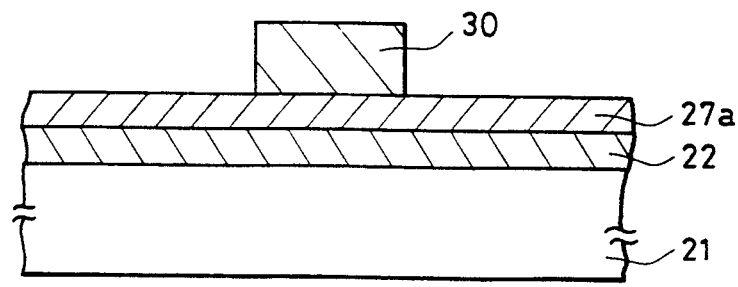
FIGS. 12A, 12B, 12C, 12D, 12E and 12F are cross sectional views sequentially showing a manufacturing process for forming the semiconductor device in accordance with the first embodiment of the present invention.
Figure 12B:
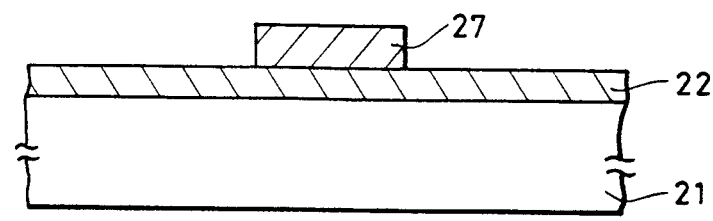
Figure 12C:
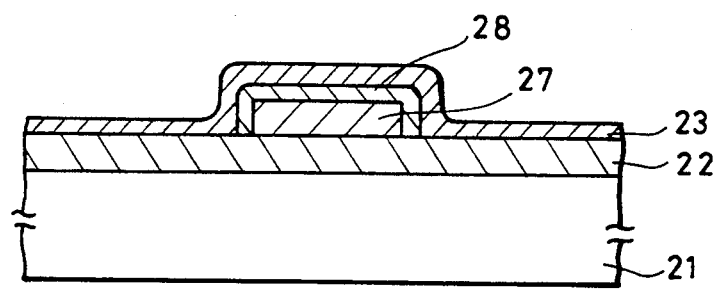
Figure 12D:
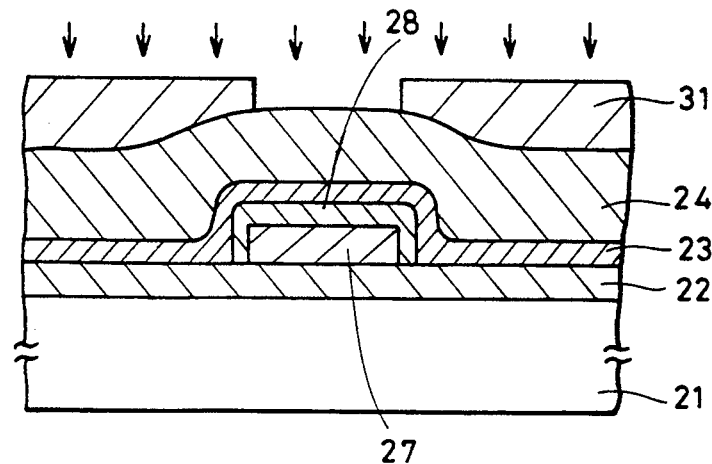
Figure 12E:
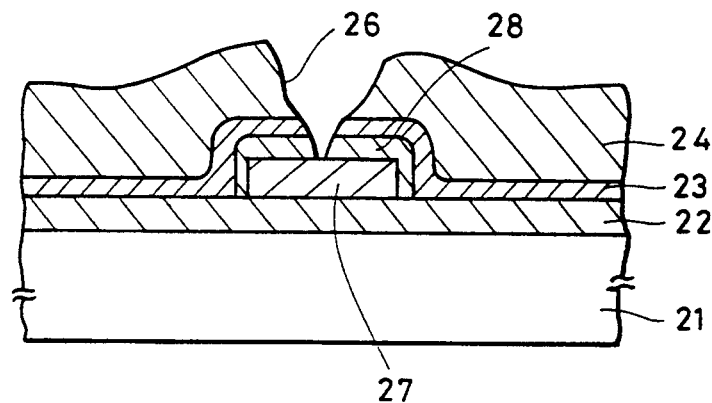
Figure 12F:
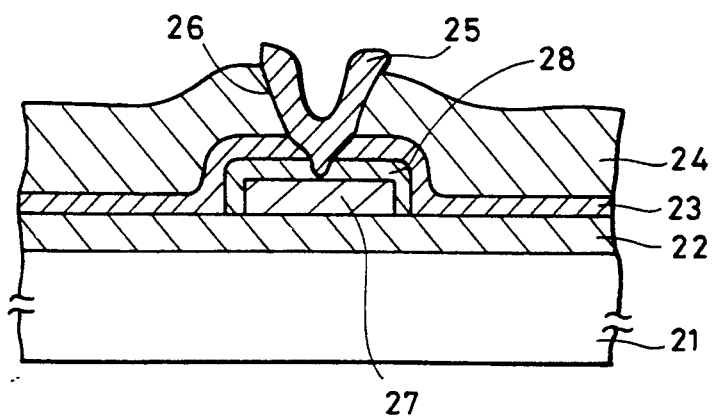
Figure 13A:
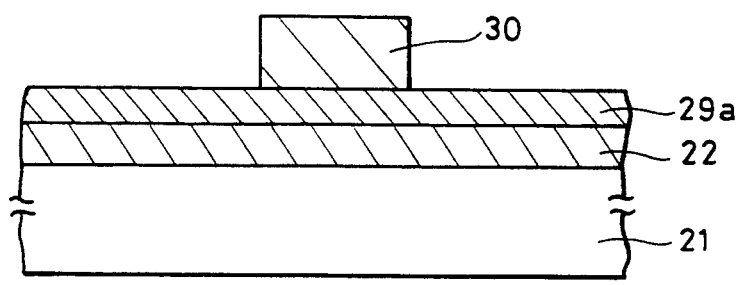
FIGS. 13A, 13B, 13C, 13D, 13E and 13F are cross sectional views sequentially showing a manufacturing process for forming the semiconductor device in accordance with the second embodiment of the present invention.
Figure 13B:
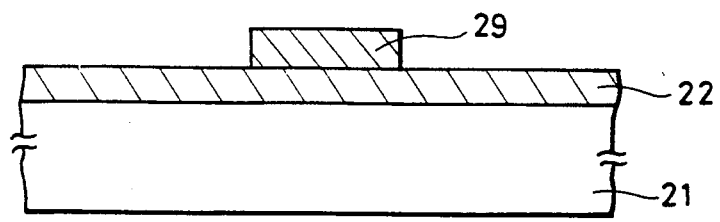
Figure 13C:
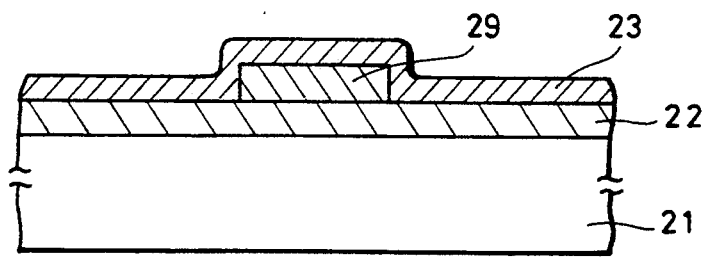
Figure 13D:
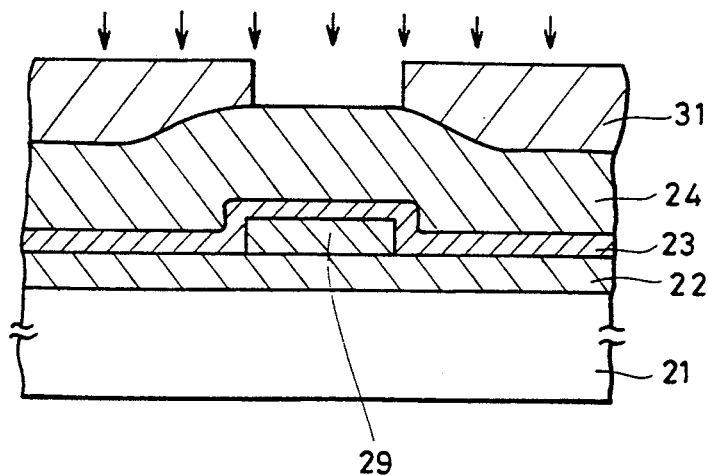
Figure 13E:
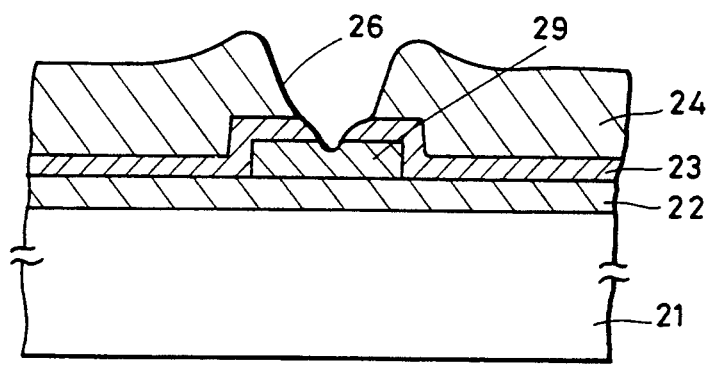
Figure 13F:
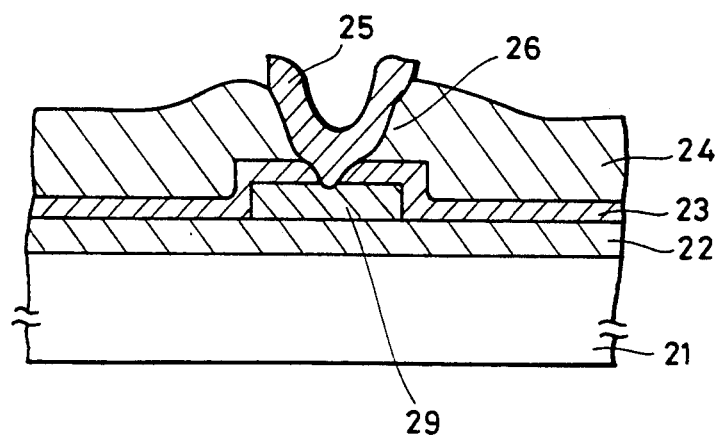

Then, a silicon oxide film is deposited on the entire surface of the conductor thin film 23 by the CVD method to form a second insulating film 24 having a thickness of the order of 3000Å, and furthermore a resist film 31 for forming a contact hole is patterned on the surface of it by the photolithography to apply an anisotropic etching (see FIG. 12D). By this anisotropic etching, the resist film 31 is removed after the contact hole is formed over a region of the conductor layer 27 (see FIG. 12E). In this anisotropic etching, a mixed gas of, for example, CHF$_3$ and O$_2$ is used as an etching gas, and the selection ratio of the silicon oxide film and the polysilicon film in this case is on the order of 5-8:1. Therefore, if the conductor thin film 23 is sufficiently thick, the conductor thin film 23 is not penetrated in etching the second insulating film 24 to form the contact hole. The conductor thin film 23, however, is extremely thin, i.e., 200Å–500Å due to the need for planarization with high integration density, so that there is a good possibility that the penetration is caused regardless of the difference of the selection ratio. In that case as well, the conductor layer 27 formed in the region immediately below the contact hole 26 prevents the etching from proceeding.

Then, a conductor film including aluminum or the like is formed on the second insulating film 24, and patterned to form an interconnection layer 25 (see FIG.

12F). This interconnection layer 25 is electrically connected to the thin conductor film 3 through the contact hole 26, and etching of the contact hole 26 is prevented from proceeding at the conductor layer 27, so that insulation between the interconnection layer 25 and the semiconductor substrate 21 is ensured.

A description will now be made of one example of the manufacturing method of the semiconductor device in accordance with the second embodiment shown in FIG. 11, referring to FIGS. 13A to 13F. In the semiconductor device in accordance with the second embodiment, firstly, the insulating film 22 is formed on the p-type semiconductor substrate 21 by the thermal oxidation, then furthermore, an oxide silicon film 29a is deposited thereon by the CVD method, having a thickness of the order of 1000Å, and the resist film 30 is patterned on the surface of it (see FIG. 13A). Then, the insulator layer 29 having a predetermined pattern is selectively formed by applying an anisotropic etching (see FIG. 13B). Subsequently, processes of forming the conductor thin film 23 over the entire surface of the semiconductor substrate 21 (see FIG. 13C), forming the second insulating film 24 on the surface thereof, then patterning the resist film 31 (see FIG. 13D), applying the anisotropic etching to form the contact hole 26 (see FIG. 13E), and then forming the interconnection layer 25 (see FIG. 13F) are the same as the processes shown in FIGS. 12C to 12F of the semiconductor device in accordance with the above-described first embodiment. In the manufacturing processes of this embodiment as well, even if the anisotropic etching proceeds in forming the contact hole 26, penetrating the conductor thin film 23, it is stopped to some degree at the insulator layer 29, so that insulation between the semiconductor substrate 21 and the interconnection layer 25 is maintained.

While in accordance with the second embodiment above, an insulating film is selectively interposed between the conductor thin film 23 and the first insulating film 22 in the region immediately below the contact hole 26, so that the manufacturing processes are comparatively simple, the effect is more remarkable when a conductor layer in an electrically floating state is interposed as in the first embodiment, taking account of the selection ratio of the etching. Additionally, in the case of a semiconductor device in which a field-effect transistor is provided in other regions, the conductor layer 27 in the first embodiment can be formed simultaneously with the gate electrode thereof.

While polysilicon is used as a material of the conductor layer 27 in the above-mentioned first embodiment, the conductor layer may include a metal having a high melting point such as titanium or the like and have the periphery covered with an oxide silicon film. That is, when the conductor layer is formed simultaneously with another element such as a gate electrode, the same material may be used for the conductor layer as that of the gate electrode.

Figure 14:
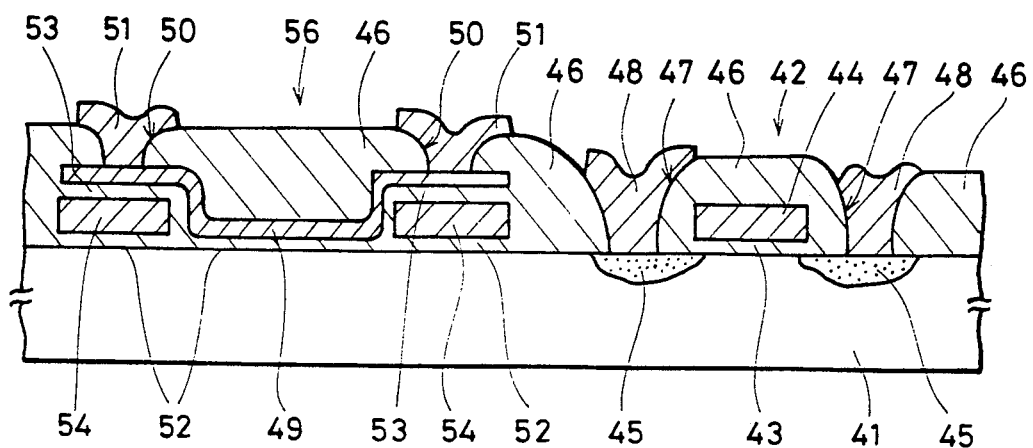
FIG. 14 is a cross sectional view showing a structure in which the structure according to the first embodiment of the present invention is applied to the case in which a MOS type field effect transistor and an interconnection structure are formed adjacent to each other.

A description will now be made of one example in which the above-described first embodiment is applied to a case in which a thin film interconnection and a thin film resistor are formed in the vicinity of a MOS type field-effect transistor, referring to FIG. 14. The cross section shown in FIG. 14 shows a structure in which a MOS type field-effect transistor 42 and an interconnection structure 56 to which the structure of the first embodiment above is applied are formed adjacent to each other on the surface of a semiconductor substrate 41. The MOS type field-effect transistor 42 mainly includes a gate electrode 44 formed on the semiconductor substrate 41 with a gate insulating film 43 interposed therebetween and source/drain regions 45, 45 formed outwardly from the vicinity immediately below opposite sidewalls of this gate electrode 44. The upper surface and side surfaces of the gate electrode 44 is covered with an insulating layer 46, contact holes 47, 47 are formed in predetermined positions of this insulating layer 46, and an interconnection layer 48 formed of aluminum or the like is connected to the source/drain regions through the contact holes 47, 47. In the interconnection structure 56, a conductor thin film 49 is connected to interconnection layers 51, 51 through contact holes 50, 50 on opposite ends thereof. The conductor thin film 49 is formed over the semiconductor substrate 41 with an insulating film 52 interposed therebetween except in the vicinity of opposite ends thereof. Conductor layers 54, 54 in an electrically floating state are formed in regions immediately below the contact holes 50, 50 with the external surfaces covered with insulating films 52, 53. These conductor layers 54, 54 correspond to the conductor layer 27 in the above-described first embodiment, and ensure insulation between the semiconductor substrate 41 and the conductor thin film 49 or the interconnection layers 51, 51 even if the conductor thin film is penetrated by the anisotropic etching at the time of forming the contact holes 50, 50.

While the conductor thin film 49 is used as an interconnection, it may constitute a thin film resistor having a predetermined resistance value. In this case, the insulating film 52 on the side of the interconnection structure 56 and the conductor layers 54, 54 can be simultaneously formed in the process of forming the gate insulating film 43 and the gate electrode 44 of the MOS type field-effect transistor 42. The material of the conductor layers 54, 54 in this case coincides with the material of the gate electrode 44. That is, if the gate electrode 44 is formed of polysilicon doped with impurities, at the time of patterning it, conductor layers 54, 54 of polysilicon are formed by simultaneously patterning the conductor layers 54, 54 as well. The gate electrode 44 and the conductor layers 54, 54 may be formed of a metal silicide having a high melting point such as titanium silicide or the like. Additionally, since the insulating film 53 is interposed between the gate electrodes 54, 54 and the conductor thin film 49, it is also possible to use each of an element of a conductor layer patterned simultaneously with the conductor layers 54, 54 and an element of a conductor thin film patterned simultaneously with the conductor thin film 49 as an independent circuit element in a multilayer structure in other region on the semiconductor substrate 41. The conductor layers 54, 54 are formed only immediately below the contact holes 50, 50 in order to prevent the resistance value from fluctuating even if the conductor thin film 49 is penetrated at the time of forming the contact holes 50, 50 when the conductor thin film 49 constitutes a resistor.

There is, for example, a resistor for oscillation circuit of an EEPROM (Electrically Erasable and Programmable ROM) as a device which employs the conductor thin film 49 as a thin film resistor.

Figure 15:
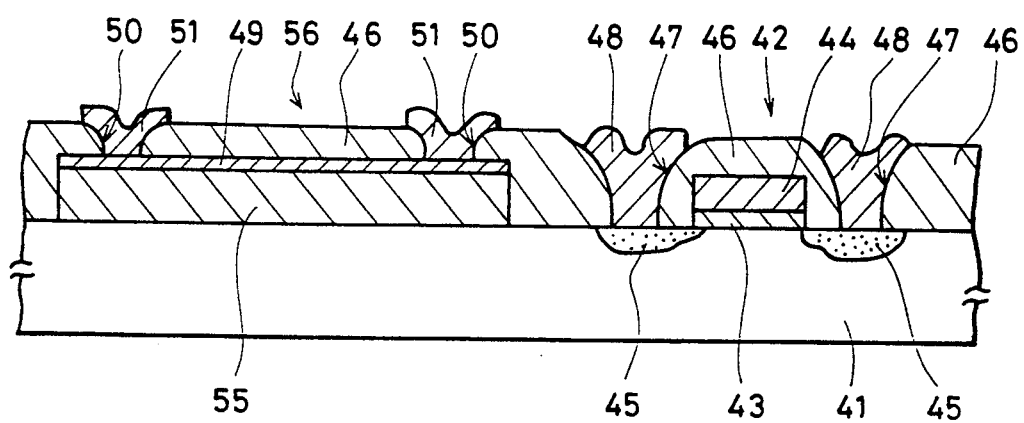
FIG. 15 is a cross sectional view showing an example in which the structure in accordance with the second embodiment of the present invention is applied in the same structure as in FIG. 14.

The structure of FIG. 15 can be obtained by applying the second embodiment above to a structure almost the same as the structure shown in FIG. 14. In FIG. 15, elements the same as or corresponding to those in the structure shown in FIG. 14 are given the same reference numerals.

The structure shown in FIG. 15 is different from the structure shown in FIG. 14 in that an insulator layer 55 is interposed between the conductor thin film 49 and the surface of the semiconductor substrate 41 over the entire length of the conductor thin film. In this case, the insulator layer 55 is different from the conductor layers 54, 54 shown in FIG. 14, cannot be formed simultaneously with the gate electrode 44 and so on and must be formed in an independent process. Even if the conductor thin film 49 is penetrated at the time of forming the contact holes 50, 50, however, the insulating film 55 hardly affects the characteristic of the conductor thin film 49 as a resistor, so that the insulating film 55 may have a uniform thickness even in the region other than the vicinity of the opposite ends of the conductor thin film 49. Therefore, the whole insulator layer 55 may be a uniform insulating film of a silicon oxide film or the like and the manufacturing process thereof is comparatively simple. Furthermore, there is no difference in level in the region where the conductor thin film 49 is formed, so that planarization process is also easily performed.

A description will now be made of one example in which the above-described second embodiment is applied to a connecting structure of a TFT (Thin Film Transistor), referring to FIG. 16. In the structure shown in FIG. 16, a gate electrode 63 having a thickness of the order of 2000Å is formed over the surface of a p-type semiconductor substrate 61 with a gate insulating film 62 having a thickness of the order of 100Å interposed therebetween, and n-type source/drain regions 64, 64 are formed outwardly from the vicinity immediately below the opposite sides of it, which constitute an n channel MOS type field-effect transistor. A thermal oxide film of the order of 100Å is formed on the upper surface of the gate electrode 63 and insulator layers 66, 66 of oxide silicon having a thickness of 2500Å-3000Å are formed on the opposite sides of the gate electrode 63. A polysilicon film 67 doped with n-type impurities, having a thickness of 200Å-500Å is formed on the thermal oxide film 65, and polysilicon films 68, 68 doped with p-type impurities are formed on the insulator layers 66, 66. These polysilicon films 67, 68, 68 constitute a so-called TFT layer 69, which constitutes an n channel MOS type field-effect transistor with the gate electrode 63. That is, the polysilicon film 67 is a channel region and the polysilicon films 68, 68 are source/drain regions. The TFT layer 69 is covered with an insulating film 70 and contact holes 71, 71 are formed in regions of the insulating film 70 above the insulator layers 66, 66. Interconnection layers 72, 72 are connected to the polysilicon films 68, 68 through the contact holes 71, 71 and the electrode of the p channel MOS type field-effect transistor is electrically connected to the upper portion. In this structure, the n channel MOS type field-effect transistor and the p channel MOS type field-effect transistor having the gate electrode 63 in common constitute a TFT inverter of a CMOS structure and the insulator layers 66, 66 correspond to the insulator layer 29 in the second embodiment stated above. In this structure, even if the polysilicon films 68, 68 are penetrated at the time of forming the contact holes 71, 71 passing through the electrode of the TFT, insulation between the source/drain regions 64, 64 of the n channel transistor and the polysilicon films 68, 68 is ensured.

Figure 16:
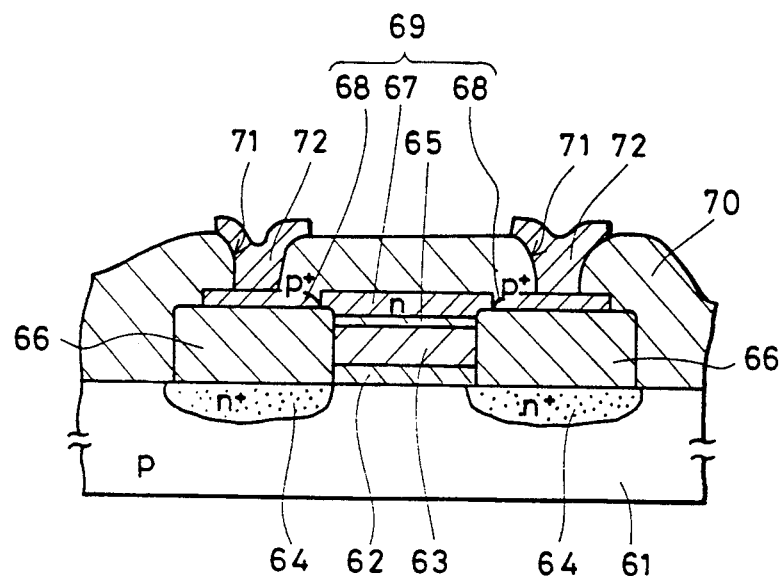
FIG. 16 is a cross sectional view showing an example in which the structure in accordance with the second embodiment of the present invention is applied to a CMOS structure including a so-called TFT layer.
Figure 17:
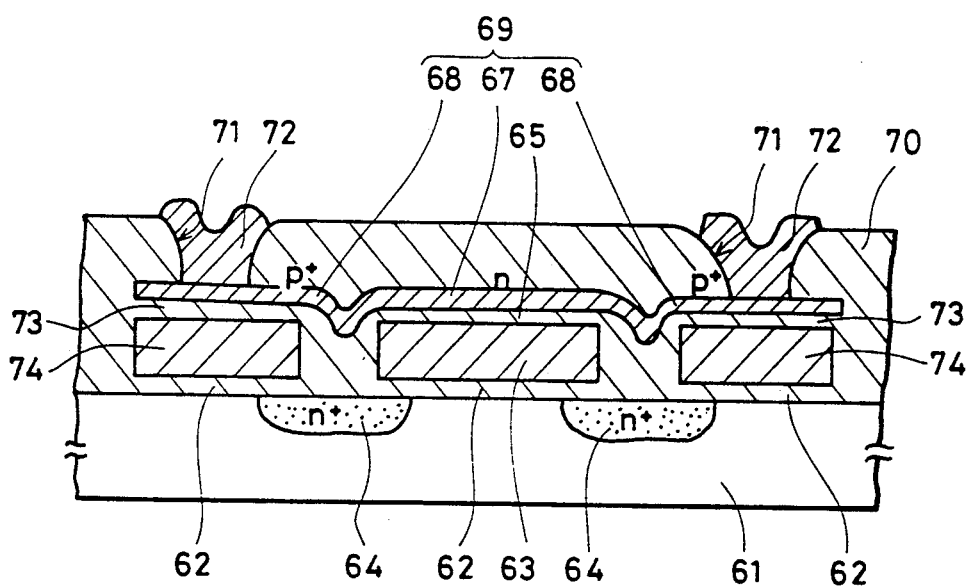
FIG. 17 is a cross sectional view showing an example in which the structure in accordance with the first embodiment of the present invention is applied to the same structure as in FIG. 16.

The structure of FIG. 17 is obtained by applying the above-described first embodiment to a structure almost the same as the structure shown in FIG. 16. The structure shown in FIG. 17 is different from the structure shown in FIG. 16 in that conductor layers 74, 74 having the external surfaces covered with the insulating films 62, 73 are formed between the polysilicon films 68, 68 and the surface of the semiconductor substrate 61 in the regions immediately below the contact holes 71, 71. The conductor layers 74, 74 correspond to the conductor layer 27 in the first embodiment above. In this case, the conductor layers 74, 74 can be formed simultaneously in the same process as that of forming the gate electrode 63.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a silicon substrate;
   a first insulating film on said silicon substrate;
   a conductor thin film 200Å to 500Å thick formed over the surface of the silicon substrate on said first insulating film;
   a second insulating film covering the upper surface of the conductor thin film;
   a contact hole through said second insulating film;
   an interconnection layer formed on the second insulating film, a portion of said interconnection layer extending through said contact hole such that said conductor thin film and said interconnection layer are electrically connected to each other through said contact hole;
   a conductor layer in an electrically floating state selectively formed between said conductor thin film and said silicon substrate at least immediately below said contact hole; and
   a third insulating film interposed between said conductor thin film and said conductor layer covering at least the periphery of said conductor layer,
   wherein the portion of said interconnection layer extending through said contact hole penetrates said third insulating film at a point directly beneath said contact hole.

2. The semiconductor device according to claim 1, wherein said conductor layer includes polysilicon or polysilicon doped with impurities and said third insulating film is a thermal oxide film.

3. The semiconductor device according to claim 1, wherein said conductor layer includes a metal having a high melting point and said third insulating film is a silicon oxide film.

4. The semiconductor device according to claim 1, wherein said conductor thin film includes polysilicon doped with impurities.

5. The semiconductor device according to claim 1, wherein said conductor thin film constitutes an interconnection or a thin film resistor, said contact hole and another contact hole are formed in said second insulating film in positions over opposite ends of said conductor thin film, and said conductor layer and said third insulating film are selectively formed between said conductor thin film and said silicon substrate immediately below both contact holes.

6. The semiconductor device according to claim 5, further comprising a MOS type field-effect transistor on said silicon substrate, the material of the gate electrode of the MOS type field-effect transistor being the same as the material of said conductor layer.

7. A semiconductor device comprising:
a silicon substrate;
a first insulating film on said silicon substrate;
a conductor thin film formed over the surface of the silicon substrate on said first insulating film;
a second insulating film covering the upper surface of the conductor thin film;
an interconnection layer formed on the second insulating film;
a contact hole through said second insulating film, said conductor thin film and said interconnection layer being electrically connected to each other through said contact hole; and
an insulator layer on said first insulating film between said conductor thin film and said silicon substrate selectively formed in regions substantially below said contact hole,
wherein only said insulator layer and said first insulating film are interposed between said conductor thin film and said silicon substrate immediately below said contact hole.

8. The semiconductor device according to claim 7, wherein said insulator layer includes silicon oxide.

9. The semiconductor device according to claim 7, wherein said conductor thin film includes polysilicon doped with impurities and has a thickness of 200Å to 500Å.

10. The semiconductor device according to claim 7, wherein said conductor thin film constitutes an interconnection or a thin film resistor, said contact hole and another contact hole are formed in said second insulating film in positions over opposite ends of said conductor thin film, and said insulator layer is formed between said conductor thin film and said silicon substrate beneath the entire region of said conductor thin film and has an almost uniform thickness.

11. A semiconductor device comprising:
a silicon substrate;
a first insulating film on said silicon substrate;
an insulator layer on said first insulating film formed selectively so as to be limited to a predetermined area above said silicon substrate, said insulator layer forming an island rising a predetermined distance above a substantially flat upper surface of said first insulating film;
a conductor thin film formed over the surface of the silicon substrate on a portion of the substantially flat upper surface of said first insulating film and directly on sides and an upper surface of the island formed by said insulator layer;
a second insulating film covering the upper surface of the conductor thin film;
an interconnection layer formed on the second insulating film; and
a contact hole through said second insulating film at a location above the island formed by said insulator layer, said conductor thin film and said interconnection layer being electrically connected to each other through said contact hole,
wherein regions of said first insulating film and said conductor thin film between said silicon substrate and said contact hole are devoid of conductive layers.

* * * * *